(12) United States Patent
Chuang et al.

(10) Patent No.: US 12,396,370 B2
(45) Date of Patent: Aug. 19, 2025

(54) MRAM STRUCTURE WITH HIGH TMR AND HIGH PMA

(71) Applicant: Taiwan Semiconductor Manufacturing Company, Ltd., Hsin-Chu (TW)

(72) Inventors: Ming-Yen Chuang, Hsinchu (TW); Wenchin Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 29 days.

(21) Appl. No.: 17/874,422

(22) Filed: Jul. 27, 2022

(65) Prior Publication Data

US 2022/0367789 A1   Nov. 17, 2022

Related U.S. Application Data

(62) Division of application No. 16/411,761, filed on May 14, 2019, now Pat. No. 11,469,369.

(51) Int. Cl.
*H10N 50/80* (2023.01)
*G11C 11/16* (2006.01)
(Continued)

(52) U.S. Cl.
CPC ........... *H10N 50/80* (2023.02); *G11C 11/161* (2013.01); *H10B 61/22* (2023.02); *H10N 50/01* (2023.02); *H10N 50/10* (2023.02)

(58) Field of Classification Search
CPC . H01L 27/20; H01L 41/06; H01L 41/12–125; H01L 41/20; H01L 41/47;
(Continued)

(56) References Cited

U.S. PATENT DOCUMENTS

2013/0008867 A1* 1/2013 Tokashiki .............. B82Y 40/00
                                                                216/22
2017/0062712 A1* 3/2017 Choi ...................... H10N 50/85
(Continued)

OTHER PUBLICATIONS

Khvalkovskiy et al. "Erratum: Basic Principles of STT-MRAM Cell Operation in Memory Arrays." J. Phys. D: Appl. Phys. 46 (2013) 139601 (1pp), published on Feb. 28, 2013.
(Continued)

*Primary Examiner* — Moin M Rahman
(74) *Attorney, Agent, or Firm* — Eschweiler & Potashnik, LLC

(57) ABSTRACT

Various embodiments of the present disclosure are directed towards a method for forming an integrated chip, the method includes forming a memory cell stack over a substrate. The memory cell stack comprises a tunnel barrier layer, a free layer over the tunnel barrier layer, a capping dielectric layer over the free layer, and a conductive capping layer on the capping dielectric layer. A conductive shunting structure is formed along outer sidewalls of the free layer, outer sidewalls of the capping dielectric layer, and outer sidewalls of the conductive capping layer. A bottommost point of the conductive shunting structure in contact with the free layer is disposed above a bottom surface of the free layer.

20 Claims, 12 Drawing Sheets

(51) Int. Cl.
*H10B 61/00* (2023.01)
*H10N 50/01* (2023.01)
*H10N 50/10* (2023.01)

(58) Field of Classification Search
CPC ......... H01L 29/82; H01L 43/02; H01L 43/12; H01L 43/08; H01L 27/222–228; H01L 43/10; H01F 1/00–447; H01F 10/00–3295; H01F 41/303; H01F 10/324–3295; H10N 50/85; H10N 50/80; H10N 50/01; H10N 50/10; H10N 35/00; G01R 33/098; G11B 5/3909; G11C 11/161; G11C 11/14–1697; G11C 11/5607; G11C 14/0036; G11C 14/0045; G11C 14/0081; G11C 19/02–10; G11C 19/14; G11C 2211/5615–5616; H10B 61/00–22

See application file for complete search history.

(56) References Cited

U.S. PATENT DOCUMENTS

| | | | |
|---|---|---|---|
| 2017/0148979 A1* | 5/2017 | Kim | G11C 11/161 |
| 2019/0189906 A1* | 6/2019 | Lee | H10N 50/80 |
| 2019/0207095 A1* | 7/2019 | Kardasz | H01F 10/3286 |
| 2019/0280195 A1 | 9/2019 | Sonoda | |

OTHER PUBLICATIONS

Dieny et al. "Perpendicular Magnetic Anisotropy at Transition Metal/Oxide Interfaces and Applications." Reviews of Modern Physics, vol. 89, Apr.-Jun. 2017, Published on Jun. 28, 2017.
Non-Final Office Action dated Apr. 27, 2021 for U.S. Appl. No. 16/411,761.
Final Office Action dated Oct. 13, 2021 for U.S. Appl. No. 16/411,761.
Notice of Allowance dated May 26, 2022 for U.S. Appl. No. 16/411,761.

* cited by examiner

MRAM STRUCTURE WITH HIGH TMR AND HIGH PMA

REFERENCE TO RELATED APPLICATION

This Application is a Divisional of U.S. application Ser. No. 16/411,761, filed on May 14, 2019, the contents of which are hereby incorporated by reference in their entirety.

BACKGROUND

Many modern day electronic devices contain electronic memory, such as hard disk drives or random access memory (RAM). Electronic memory may be volatile memory or non-volatile memory. Non-volatile memory is able to retain its stored data in the absence of power, whereas volatile memory loses its data memory contents when power is lost. Magnetic tunnel junctions (MTJs) can be used in hard disk drives and/or RAM, and thus are promising candidates for next generation memory solutions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
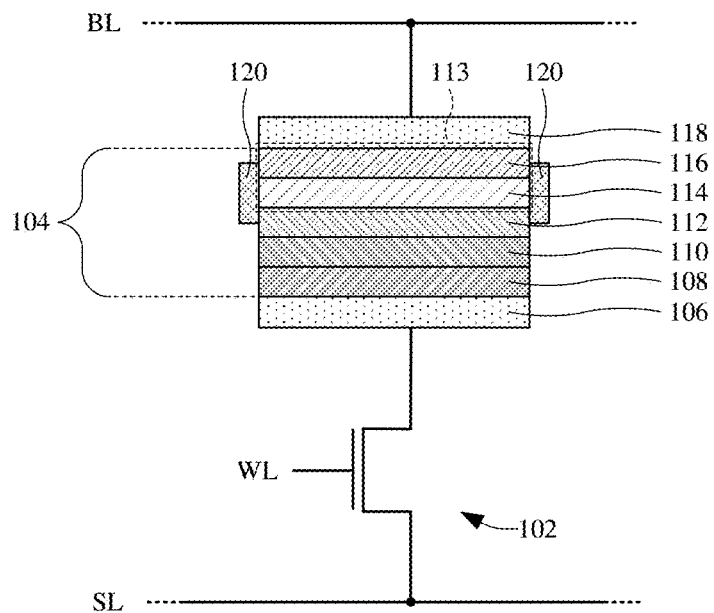
FIG. 1A illustrates some embodiments of a memory device including a magnetic tunneling junction (MTJ) memory element with a shunting structure, according to the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A magnetic tunnel junction (MTJ) stack includes first and second ferromagnetic films separated by a tunnel barrier layer. One of the ferromagnetic films (often referred to as a "reference layer") has a fixed magnetization direction, while the other ferromagnetic film (often referred to as a "free layer") has a variable magnetization direction. If the magnetization directions of the reference layer and free layer are in a parallel orientation, it is more likely that electrons will tunnel through the tunnel barrier layer, such that the MTJ stack is in a low-resistance state. Conversely, if the magnetization directions of the reference layer and free layer are in an anti-parallel orientation, it is less likely that electrons will tunnel through the tunnel barrier layer, such that the MTJ stack is in a high-resistance state. Consequently, the MTJ stack can be switched between two states of electrical resistance, a first state with a low resistance ($R_P$: magnetization directions of reference layer and free layer are parallel) and a second state with a high resistance ($R_{AP}$: magnetization directions of reference layer and free layer are anti-parallel). Because of this binary nature, MTJ stacks are often used in memory cells to store digital data, with the low resistance state $R_P$ corresponding to a first data state (e.g., logical "0"), and the high-resistance state $R_{AP}$ corresponding to a second data state (e.g., logical "1").

Typically, the reference layer, the free layer, and the tunnel barrier layer of an MTJ are manufactured to have high perpendicular magnetic anisotropy (PMA). High PMA provides an MTJ with a low write current and distinct data states. In an MTJ, high PMA may be achieved at metal/oxide interfaces. Thus, to achieve high PMA, a conductive capping layer and a capping metal oxide layer are disposed between a top electrode and the free layer (such that the free layer is sandwiched between the capping metal oxide layer and the tunnel barrier layer). However, the capping metal oxide layer introduces a series resistance between the free layer and the top electrode, thus increasing the set voltage, and increasing power consumption of the MTJ stack. Therefore, while the capping metal oxide layer facilitates high PMA in the MTJ stack, it also introduces a series resistance that degrades the performance of the MTJ stack.

In some embodiments, the present disclosure relates to an MTJ stack comprising a shunting structure that provides the MTJ with a high PMA and low series resistance. The MTJ stack comprises a bottom electrode, a reference layer, a tunnel layer, a free layer, a capping metal oxide layer, a conductive capping layer, a top electrode, and a shunting structure. The shunting structure electrically shorts the free layer to the conductive capping layer and/or the top electrode, whereby the shunting structure mitigates an effect of the series resistance of the capping metal oxide layer. Thus, the capping metal oxide layer may enhance and/or preserve the PMA of the MTJ stack while the shunting structure mitigates the effect of the series resistance introduced by the capping metal oxide layer. This, in turn, preserves the high PMA of the MTJ stack while reducing the set voltage, and reducing the power consumption of the MTJ stack.

Referring to FIG. 1A, some embodiments of a memory device 100a with a capping dielectric layer 114 and a shunting structure 120 is provided.

The memory device 100a includes a magnetic tunnel junction (MTJ) memory element 104 and an access transistor 102. The MTJ memory element 104 comprises a reference layer 108, a tunnel barrier layer 110, a free layer 112, a capping layer 113, and a shunting structure 120. In some embodiments, the capping layer 113 comprises a capping dielectric layer 114 and a conductive capping layer 116. In some embodiments, the conductive capping layer 116 may comprise a metal and the capping dielectric layer 114 may, for example, be or comprise metal oxide such as aluminum oxide, magnesium oxide, or the like.

A bit line (BL) is coupled to one end of the MTJ memory element 104 through a top electrode 118, and a source line (SL) is coupled to an opposite end of the MTJ memory element 104 through the access transistor 102. Thus, application of a suitable word line (WL) voltage to a gate electrode of the access transistor 102 electrically couples the MTJ memory element 104 between the BL and the SL. Consequently, by providing suitable bias conditions, the MTJ memory element 104 can be switched between two states of electrical resistance, a first state with a low resistance (magnetization directions of the reference layer 108 and the free layer 112 are parallel) and a second state with a high resistance (magnetization directions of the reference layer 108 and the free layer 112 are anti-parallel), to store data.

In some embodiments, a metal/oxide interface between the free layer 112 and the capping dielectric layer 114 may facilitate perpendicular magnetic anisotropy (PMA) of the MTJ memory element 104. A volume of the free layer 112 may affect the PMA of the MTJ memory element 104. For example, if the free layer 112 has a high volume, then the MTJ memory element 104 may have a high PMA, conversely if the free layer 112 has a low volume, then the MTJ memory element 104 may have a low PMA. However, in some embodiments, as a volume of the free layer 112 increases, a volume of the capping dielectric layer 114 increases to preserve the PMA of the MTJ memory element 104. The capping dielectric layer 114 may introduce a series resistance between the free layer 112 and the top electrode 118. As the volume of the capping dielectric layer 114 increases, the series resistance may increase as well.

To mitigate an effect of the series resistance of the capping dielectric layer 114, the shunting structure 120 directly contacts and continuously extends along outer sidewalls of the free layer 112, outer sidewalls of the capping dielectric layer 114, and outer sidewalls of the conductive capping layer 116. The shunting structure 120 comprises a conductive structure that is configured to electrically couple the free layer 112 directly to the conductive capping layer 116 and/or the top electrode 118, thereby reducing the series resistance of the capping dielectric layer 114. This facilitates enhancement and/or preservation of the high PMA of the MTJ memory element 104 while reducing the set voltage, and reducing the power consumption of the MTJ memory element 104.

Figure 1B:
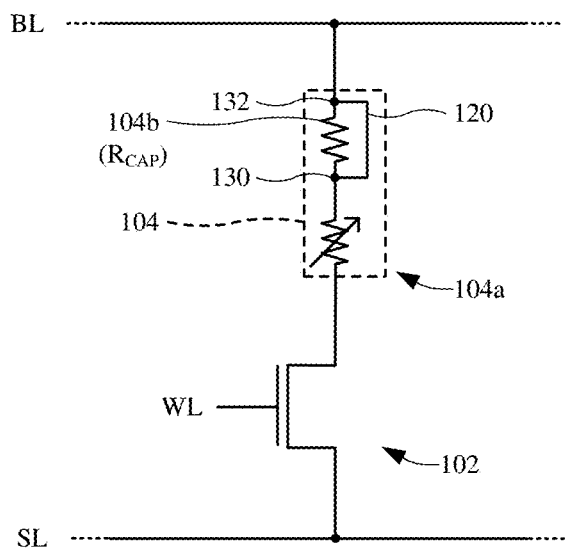
FIG. 1B illustrates some embodiments of a circuit diagram of the memory device of FIG. 1A, according to the present disclosure.

Referring to FIG. 1B, some embodiments of a circuit 100b of the memory device 100a of FIG. 1A is provided.

The circuit 100b includes the MTJ memory element 104 electrically coupled to the access transistor 102. The MTJ memory element 104 comprises a variable resistor 104a, a series resistance 104b, and a shunting structure 120. The series resistance 104b ($R_{CAP}$) corresponds to a resistance introduced by the capping dielectric layer (114 of FIG. 1A). The shunting structure 120 extends from a first node 130 electrically coupled to the variable resistor 104a to a second node 132 electrically coupled to the bit line (BL). Thus, the shunting structure 120 may reduce an effect of the series resistance 104b ($R_{CAP}$) while the enhancement and/or preservation of the PMA of the MTJ memory element 104 by the capping dielectric layer (114 of FIG. 1A) is maintained. Further, resistance states and/or values of the variable resistor 104a may correspond to the resistance states of the MTJ memory element 104, for example, a low resistance state ($R_P$, which can for example correspond to a "0" state) and a high resistance state ($R_{AP}$, which can for example correspond to a "1" state). During operation of the MTJ memory element 104, the low resistance state ($R_P$) of the variable resistor 104a occurs when the magnetization of the reference layer (108 of FIG. 1A) and the free layer (112 of FIG. 1A) are parallel (e.g., both point "up"), while the high resistance state ($R_{AP}$) of the variable resistor 104a occurs when the magnetization of the reference layer (108 of FIG. 1A) and the free layer (112 of FIG. 1A) are anti-parallel (e.g., one points "up" and the other points "down"). Thus, the MTJ memory element 104 may have one of two distinct resistive states (e.g., $R_P$ or $R_{AP}$), such that a magnetoresistance (MR) ratio of the MTJ memory element 104 corresponds to $$\frac{R_{AP} - R_P}{R_P}.$$

In some embodiments, if the shunting structure 120 is omitted (not shown) a MR ratio of the MTJ memory element 104 may correspond to $$\frac{R_{AP} - R_P}{R_P + R_{CAP}},$$

such that the MR ratio is lower without the shunting structure 120. Therefore, the shunting structure 120 may increase the MR ratio of the MTJ memory element 104 while reducing the set voltage, and reducing the power consumption of the MTJ memory element 104.

Figure 2A:
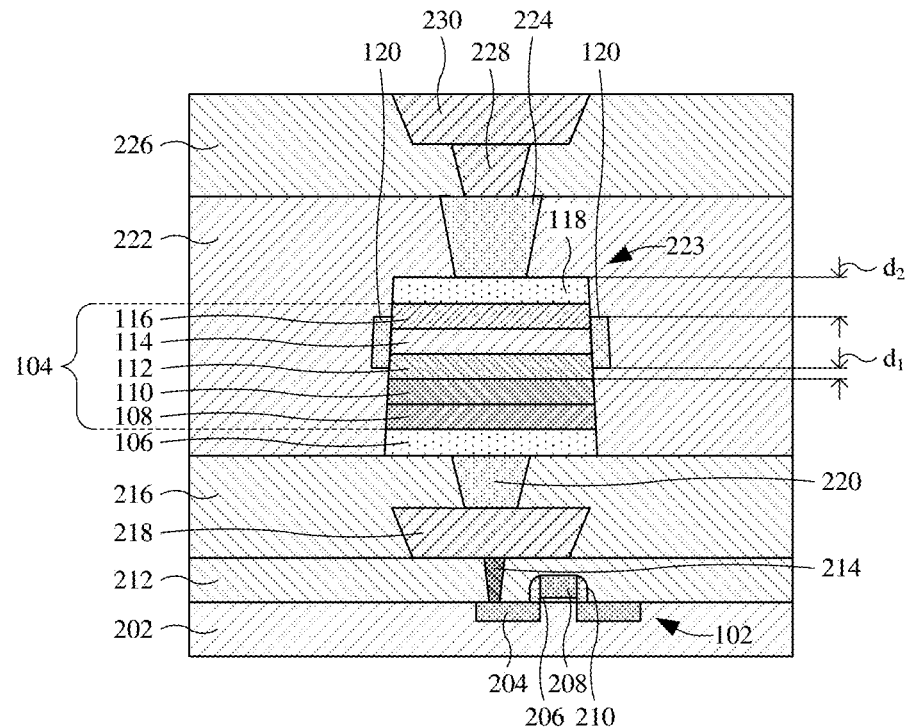
FIGS. 2A-2E illustrate cross-sectional views of some embodiments of the memory device of FIG. 1A, according to the present disclosure.

Referring to FIG. 2A, a cross-sectional view of a memory device 200a corresponding to some alternative embodiments of the memory device 100a of FIG. 1A is provided.

The memory device 200a includes the access transistor 102 and a memory cell 223. The access transistor 102 is disposed over a semiconductor substrate 202. The semiconductor substrate 202 may be, for example, a bulk substrate (e.g., a bulk monocrystalline silicon substrate) or a siliconon-insulator (SOI) substrate. The access transistor 102 includes source/drain regions 204, an access gate dielectric layer 206, an access gate electrode 208, and sidewall spacers 210. The source/drain regions 204 are disposed within the semiconductor substrate 202, and are doped to have a first conductivity type which is opposite a second conductivity type of a channel region under the access gate dielectric layer 206. Sidewall spacers 210 surround outer sidewalls of the access gate dielectric layer 206 and outer sidewalls of the access gate electrode 208. A source/drain region 204 of the access transistor 102 is electrically coupled to the memory cell 223 by way of overlying metal layer (e.g., a conductive contact 214).

An inter-layer dielectric (ILD) structure 212 overlies the semiconductor substrate 202. In some embodiments, the ILD structure 212 may comprise multiple ILD layers and/or multiple dielectric materials. A conductive contact 214 extends from a bottom conductive wire 218 through the ILD structure 212 to the source/drain region 204. A first inter-metal dielectric (IMD) structure 216 overlies the ILD structure 212. The bottom conductive wire 218 is disposed within the first IMD structure 216 and underlies a bottom electrode via 220. The bottom electrode via 220 extends through the first IMD structure 216 and electrically couples the memory cell 223 to the bottom conductive wire 218. In some embodiments, the first IMD structure 216 comprises multiple IMD layers and/or multiple dielectric materials. The memory cell 223 is disposed over the bottom electrode via 220 and the first IMD structure 216. The memory cell 223 is disposed within a second IMD structure 222. A top electrode via 224 extends through the second IMD structure 222 to the memory cell 223. The top electrode via 224 is electrically coupled to the bottom electrode via 220 by way of the memory cell 223. In some embodiments, the second IMD structure 222 may, for example, be or comprise silicon dioxide, borosilicate glass, tetra-ethyl-ortho-silicate (TEOS), aluminum nitride, aluminum oxide, or the like.

The memory cell 223 may, for example, be configured as a magneto-resistive random access memory (MRAM) cell, a spin-transfer torque MRAM cell, or another suitable random access memory cell. The memory cell 223 comprises a bottom electrode 106, a MTJ memory element 104, and a top electrode 118. The MTJ memory element 104 comprises a reference layer 108, a tunnel barrier layer 110, a free layer 112, a capping dielectric layer 114, a conductive capping layer 116, and a shunting structure 120. The shunting structure 120 continuously extends along outer sidewalls of the free layer 112, outer sidewalls of the capping dielectric layer 114, and outer sidewalls of the conductive capping layer 116. The shunting structure 120 is configured to directly couple the free layer 112 to the conductive capping layer 116, such that an effect of the series resistance introduced by the capping dielectric layer 114 is mitigated. Thus, the shunting structure 120 increases the MR ratio of the memory cell 223 while reducing the set voltage, and reducing the power consumption of the memory cell 223.

A bottom surface of the shunting structure 120 is separated from a top surface of the tunnel barrier layer 110 by a first distance $d_1$. In some embodiments, if the shunting structure 120 is not separated from the tunnel barrier layer 110 by the first distance $d_1$ (i.e., the first distance $d_1$ is negative) then the tunnel barrier layer 110 may be directly electrically coupled to the capping dielectric layer 114 and/or the conductive capping layer 116. This, in part, may render the memory cell 223 inoperable, such that the MTJ memory element 104 may not be able to switch between the low resistance state ($R_P$) and the high resistance state ($R_{AP}$), or vice versa. In further embodiments, if the shunting structure 120 does not extend over the outer sidewalls of the free layer 112 (i.e., the first distance $d_1$ is greater than a thickness of the free layer 112) then the conductive capping layer 116 may not be directly electrically coupled to the free layer 112. This, in part, may decrease the MR ratio of the memory cell 223 because an effect of the series resistance of the capping dielectric layer 114 between the top and bottom electrodes 118, 106 has not been reduced (e.g., by the shunting structure 120).

A top surface of the shunting structure 120 is separated from a top surface of the top electrode 118 by a second distance $d_2$. In some embodiments, if the top surface of the shunting structure 120 is not above a top surface of the capping dielectric layer 114 (i.e., the second distance $d_2$ is greater than a thickness of the top electrode 118 and the conductive capping layer 116) then the conductive capping layer 116 may not be directly electrically coupled to the free layer 112. This, in part, may decrease the MR ratio of the memory cell 223 because an effect of the series resistance of the capping dielectric layer 114 between the top and bottom electrodes 118, 106 has not been reduced (e.g., by the shunting structure 120).

A top dielectric structure 226 is disposed over the second IMD structure 222. A top conductive via 228 extends from a top conductive wire 230 through the top dielectric structure 226 to the top electrode via 224, such that the top conductive wire 230 is electrically coupled to the access transistor 102. In some embodiments, a voltage may be applied between the bottom and top conductive wires 218, 230 to change a resistive state of the memory cell 223.

In some embodiments, the bottom electrode 106 may, for example, be or comprise copper, tantalum, titanium, tantalum nitride, titanium nitride, tungsten, carbon, gold, silver, or the like. In some embodiments, the reference layer 108 may, for example, be or comprise copper, iron, boron, platinum, ruthenium, iridium, chromium, magnesium, tantalum, molybdenum, tungsten, or the like. In some embodiments, the reference layer 108 may comprise multiple layers, multiple alloys, magnetic materials, a seed layer, a hard layer, a pinning layer, or any combination of the aforementioned. In some embodiments, the tunnel barrier layer 110 may, for example, be or comprise metal oxide, a semiconductor material, aluminum oxide, magnesium oxide, or the like. In some embodiments, the free layer 112 may, for example, be or comprise copper, iron, boron, platinum, ruthenium, iridium, chromium, magnesium, tantalum, molybdenum, tungsten, or the like. In some embodiments, the free layer 112 may comprise multiple layers, multiple alloys, magnetic materials, or any combination of the aforementioned. In some embodiments, the conductive capping layer 116 may, for example, be or comprise copper, iron boron, platinum, ruthenium, iridium, chromium, magnesium, tantalum, titanium, tantalum nitride, titanium nitride, tungsten, carbon, gold, silver, or the like. In some embodiments, the top electrode 118 may, for example, be or comprise copper, tantalum, titanium, tantalum nitride, titanium nitride, tungsten, carbon, gold, silver, or the like. In some embodiments, the shunting structure 120 may, for example, be or comprise copper, tantalum, titanium, tantalum nitride, titanium nitride, tungsten, carbon, copper, iron, boron, platinum, ruthenium, iridium, chromium, magnesium, molybdenum, or the like. In some embodiments, the shunting structure 120 may comprise a conductive material of the free layer 112, a conductive material of the reference layer 108, and/or a conductive material of the bottom electrode 106. In some embodiments, the reference layer 108 can have a fixed or "pinned" magnetic orientation, while the free layer 112 has a variable or "free" magnetic orientation, which can be switched between two or more distinct magnetic polarities that each represents a different data state, such as a different binary state. In some embodiments, the shunting structure 120 does not contact the tunnel barrier layer 110, the reference layer 108, and/or the bottom electrode 106.

Figure 2B:
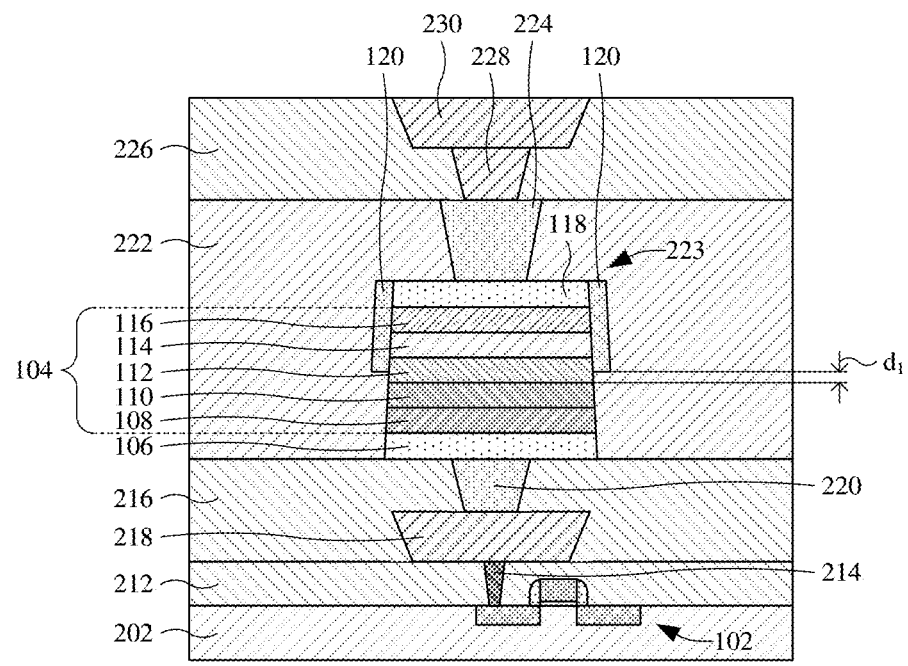

Referring to FIG. 2B, a cross-sectional view of a memory device 200b corresponding to some alternative embodiments of the memory device 200a of FIG. 2A is provided.

FIG. 2B illustrates an embodiment of the memory device (200a of FIG. 2A) in which the top surface of the shunting structure 120 is substantially aligned with the top surface of the top electrode 118. This, in turn, directly electrically couples the free layer 112 to the top electrode 118.

Figure 2C:
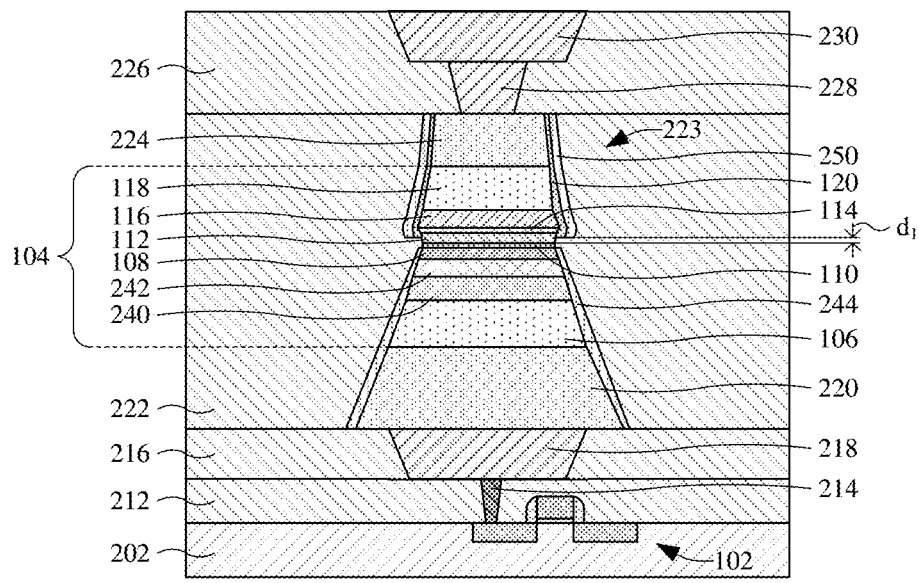

Referring to FIG. 2C, a cross-sectional view of a memory device 200c corresponding to some alternative embodiments of the memory device 200a of FIG. 2A is provided.

FIG. 2C illustrates an embodiment of the memory device (200a of FIG. 2A) in which the shunting structure 120 envelopes the top electrode via 224, the top electrode 118, the conductive capping layer 116, the capping dielectric layer 114, and a portion of the free layer 112. In some embodiments, the shunting structure 120 does not contact the tunnel barrier layer 110. In further embodiments, a bottom surface of the shunting structure 120 is aligned with a bottom surface of the free layer 112 (not shown). A first sidewall spacer 244 envelopes the reference layer 108, a hard bias layer 242, a seed layer 240, the bottom electrode 106, and the bottom electrode via 220. In some embodiments, the seed layer 240 may have a strong face-centered-cubic (fcc) structure with (111) orientation to help the MTJ memory element 104 grow so as to reduce the presence of small imperfections (e.g., grain boundaries) in the MTJ memory element 104. This provides the MTJ memory element 104 with a high quality fcc (111) lattice and improves the MR ratio of the MTJ memory element 104. In further embodiments, the hard bias layer 242 may be configured to have an opposite magnetization of the reference layer 108. In some embodiments, a top surface of the first sidewall spacer 244 is aligned with a top surface of the reference layer 108. In some embodiments, the first sidewall spacer 244 may, for example, be or comprise tetra-ethyl-ortho-silicate (TEOS), aluminum nitride, aluminum oxide, silicon nitride, silicon oxy-nitride, silicon carbide, or the like.

In some embodiments, an upper sidewall spacer 250 envelopes the shunting structure 120. The upper sidewall spacer 250 may comprise an oxide of material(s) the shunting structure 120 is comprised of. In further embodiments, the first sidewall spacer 244 and the upper sidewall spacer 250 may comprise a same material with approximately a same thickness. The upper sidewall spacer 250 may enhance electrically isolation of the memory cell 223 from adjacent semiconductor devices. In further embodiments, the upper sidewall spacer 250 is omitted (not shown).

Figure 2D:
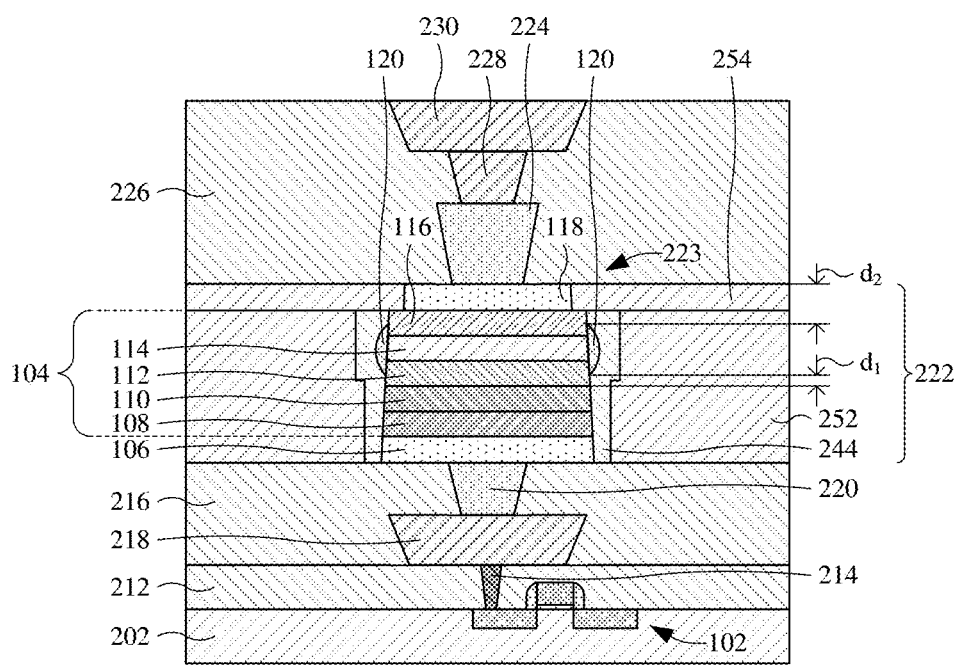

Referring to FIG. 2D, a cross-sectional view of a memory device 200d corresponding to some alternative embodiments of the memory device 200a of FIG. 2A is provided.

FIG. 2D illustrates an embodiment of the memory device (200a of FIG. 2A) in which the MTJ memory element 104 is enveloped by a first sidewall spacer 244. In some embodiments, the first sidewall spacer 244 is configured to electrically isolate the memory cell 223 from adjacent semiconductor devices (e.g., an adjacent memory cell). The second IMD structure 222 comprises a second IMD layer 254 overlying a first IMD layer 252 such that the top electrode 118 extends through the second IMD layer 254. In yet further embodiments, a width of the first sidewall spacer 244 decreases from a top surface of the conductive capping layer 116 to a bottom surface of the bottom electrode 106. Outer sidewalls of the top electrode 118 are laterally between outer sidewalls of the conductive capping layer 116.

Figure 2E:
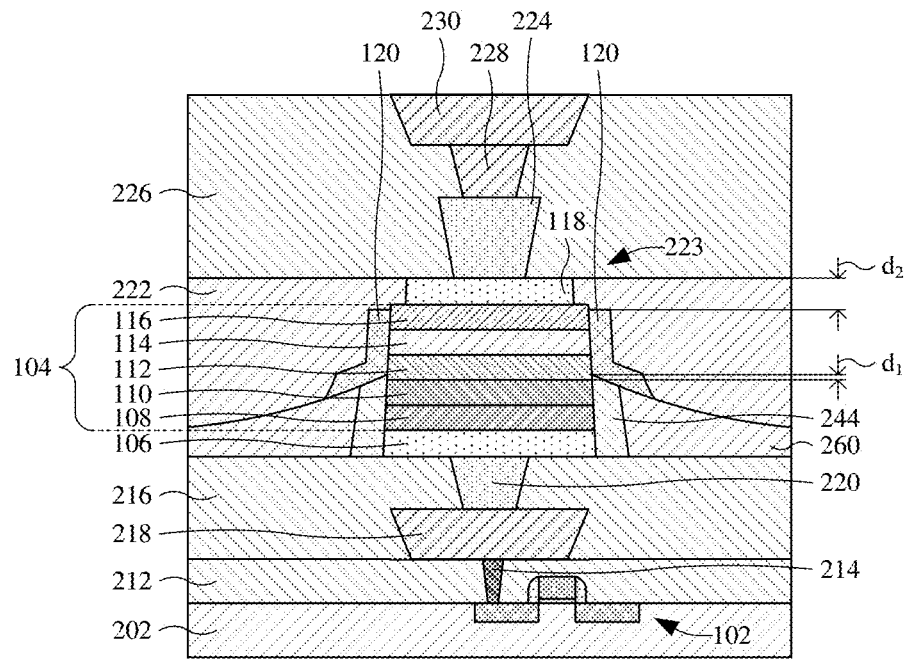

Referring to FIG. 2E, a cross-sectional view of a memory device 200e corresponding to some alternative embodiments of the memory device 200a of FIG. 2A is provided.

FIG. 2E illustrates an embodiment of the memory device (200a of FIG. 2A) in which a bottom surface of the shunting structure 120 is below a top surface of the tunnel barrier layer 110. The shunting structure 120 continuously contacts and extends from the conductive capping layer 116, along the capping dielectric layer 114 to the free layer 112. The shunting structure 120 comprises a vertically extending segment and a horizontally extending segment that protrudes outward from a sidewall of the shunting structure 120 defining the vertically extending segment.

In some embodiments, the shunting structure 120 does not contact the tunnel barrier layer 110 and/or any layers in the memory cell 223 underlying the tunnel barrier layer 110. A first sidewall spacer 244 extends along sidewalls of the free layer 112, sidewalls of the tunnel barrier layer 110, sidewalls of the reference layer 108, and sidewalls of the bottom electrode 106. In some embodiments, the horizontally extending segments of the shunting structure 120 laterally extends past outer sidewall of the first sidewall spacer 244. A second sidewall spacer 260 surrounds the outer sidewalls of the first sidewall spacer 244. In some embodiments, a top surface of the second sidewall spacer 260 is below a top surface of the tunnel barrier layer 110. In yet further embodiments, the first and second sidewall spacers 244, 260 are configured to electrically isolate layers of the memory cell 223 underlying the free layer 112 from the shunting structure 120. In some embodiments, the second sidewall spacer 260 may, for example, be or comprise tetra-ethyl-ortho-silicate (TEOS), aluminum nitride, aluminum oxide, or the like.

Figure 3:
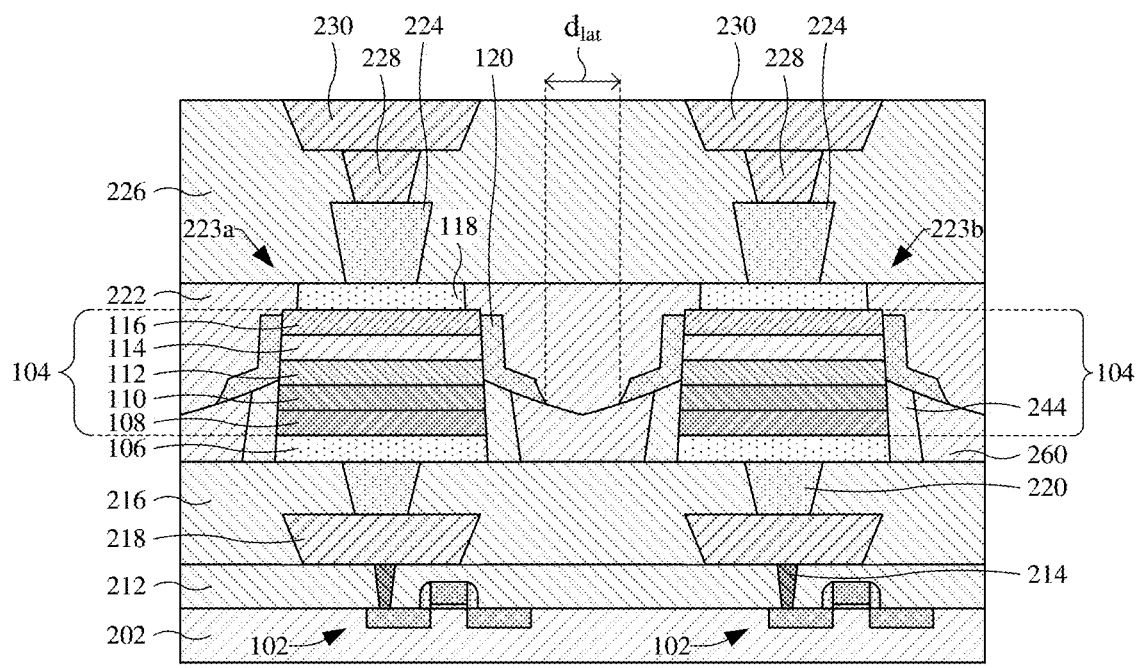
FIG. 3 illustrates a cross-sectional view of some alternative embodiments of the memory device of FIG. 2E, according to the present disclosure.

Referring to FIG. 3, a cross-sectional view of a memory device 300 corresponding to some alternative embodiments of the memory device 200e of FIG. 2E is provided.

FIG. 3 illustrates an embodiment of the memory device (200e of FIG. 2E) in which a first memory cell 223a is separated from a second memory cell 223b by a lateral distance $d_{lat}$. The lateral distance $d_{lat}$ is sufficiently large to electrically isolate the first and second memory cells 223a, 223b from one another.

Figure 4:
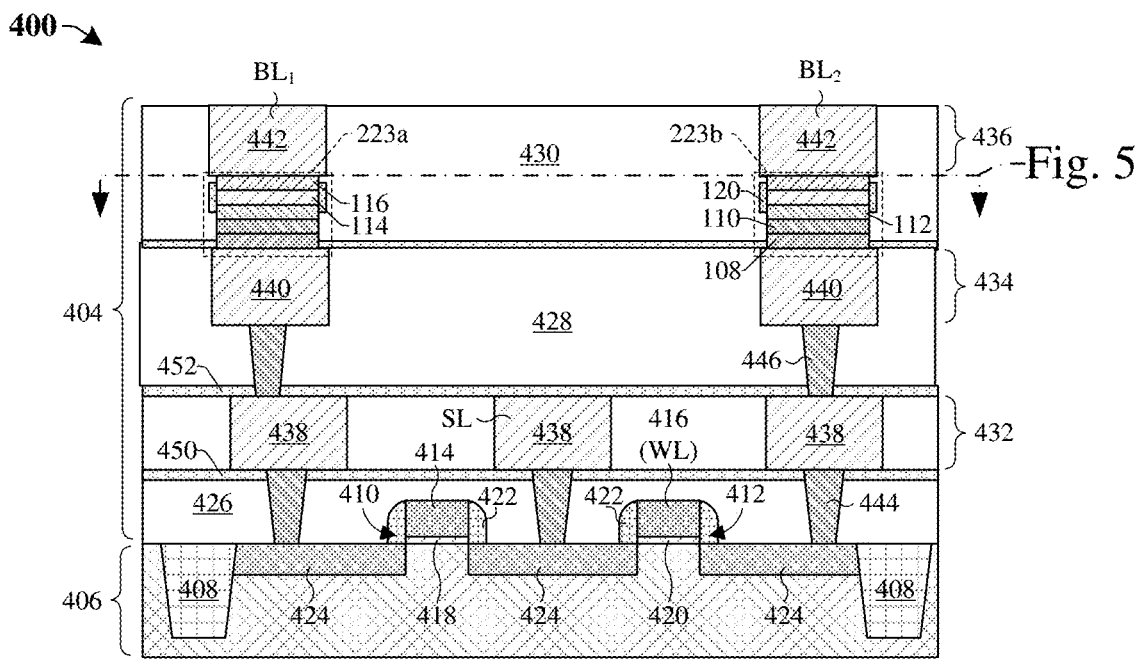
FIG. 4 illustrates a cross-sectional view of some embodiments of an integrated circuit including two MTJ memory elements with respective shunting structures, according to the present disclosure.

Referring to FIG. 4, a cross-sectional view of an integrated circuit 400 including a first memory cell 223a and a second memory cell 223b disposed in an interconnect structure 404 is provided.

The integrated circuit 400 includes a substrate 406. The substrate 406 may, for example, be a bulk substrate (e.g., a bulk silicon substrate) or a silicon-on-insulator (SOI) substrate. The illustrated embodiment depicts one or more shallow trench isolation (STI) regions 408, which may include a dielectric-filled trench within the substrate 406.

Two access transistors 410, 412 are disposed between the STI regions 408. The access transistors 410, 412 include access gate electrodes 414, 416, respectively; access gate dielectrics 418, 420, respectively; access sidewall spacers 422; and source/drain regions 424. The source/drain regions 424 are disposed within the substrate 406 between the access gate electrodes 414, 416 and the STI regions 408, and are doped to have a first conductivity type which is opposite a second conductivity type of a channel region under the gate dielectrics 418, 420, respectively. The access gate electrodes 414, 416 may, for example, be doped polysilicon, or a metal, such as aluminum, copper, or combinations thereof. The access gate dielectrics 418, 420 may, for example, be or comprise an oxide, such as silicon dioxide, or a high-κ dielectric material. As used herein, a high-κ dielectric material is a dielectric material with a dielectric constant greater than 3.9. The access sidewall spacers 422 may, for example, be made of silicon nitride. In some embodiments, the access transistor 410 and/or the access transistor 412 may, for example, be electrically coupled to a word line (WL) such that an appropriate WL voltage can be applied to the access gate electrode 414 and/or the access gate electrode 416.

The interconnect structure 404 is arranged over the substrate 406 and includes a plurality of inter-metal dielectric (IMD) layers 426, 428, 430, and a plurality of metallization layers 432, 434, 436 which are layered over one another in alternating fashion. The IMD layers 426, 428, 430 may be made, for example, of a low-K dielectric material, such as un-doped silicate glass, or an oxide, such as silicon dioxide. The metallization layers 432, 434, 436 include metal lines 438, 440, 442, which are formed within trenches, and which may be made of a metal, such as copper or aluminum. Conductive contacts 444 extend from the bottom metallization layers 432 to the source/drain regions 424 and/or gate electrodes 414, 416; and conductive vias 446 extend between the metallization layers 432, 434, 436. The conductive contacts 444 and the conductive vias 446 extend through dielectric protections layers 450, 452 (which can be made of dielectric material and can act as etch stop layers during manufacturing). The dielectric protection layers 450, 452 may be made of a nitride (e.g., silicon nitride), a carbide (e.g., silicon carbide), an oxide (e.g., silicon oxy-nitride), for example. The conductive contacts 444 and the conductive vias 446 may be made of a metal, such as copper or tungsten, for example. In some embodiments, a metal line 438 may, for example, be electrically coupled to a source line (SL) such that an output of the access transistors 410, 412 may be accessed at the SL.

The first and second memory cells 223a, 223b, which are configured to store respective data states, are arranged within the interconnect structure 404 between neighboring metal layers. The first and second memory cells 223a, 223b respectively include a reference layer 108, a tunnel barrier layer 110, a free layer 112, a capping dielectric layer 114, a conductive capping layer 116, and a shunting structure 120. The first and second memory cells 223a, 223b are respectively connected to a first bit-line $BL_1$ and a second bit-line $BL_2$ through the metal line 442.

Figure 5:
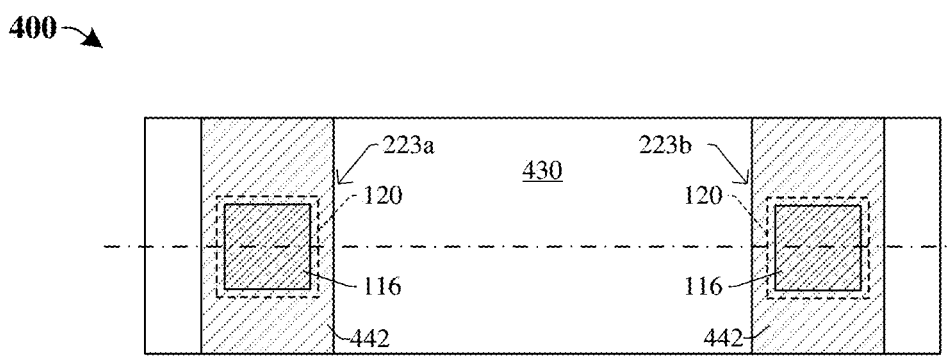
FIG. 5 illustrates some embodiments of a top view of the integrated circuit of FIG. 4, as indicated by the cut-lines in FIGS. 4 and 5, according to the present disclosure.

FIG. 5 depicts some embodiments of a top view of the integrated circuit 400 of FIG. 4, as indicated by the cut-away lines shown in FIGS. 4-5.

The first and second memory cells 223a, 223b can have a square, rectangular, elliptic, and/or circular shape when viewed from above in some embodiments. In other embodiments, however, for example due to practicalities of many etch processes, the corners of the illustrated square shape can become rounded resulting in the first and second memory cells 223a, 223b having a square shape with rounded corners, or having a circular shape. The first and second memory cells 223a, 223b are arranged over metal lines (440 of FIG. 4), respectively, and have upper portions in direct electrical connection with the metal lines 442, respectively, without vias or contacts there between in some embodiments. In other embodiments, vias, contacts, electrodes, and/or electrode vias couple the upper portion to the metal lines 442 and/or couple lower portions of the first and second memory cells 223a, 223b to the metal lines (440 of FIG. 4) (not shown). The shunting structure 120 of the first and second memory cells 223a, 223b respectively surround outer sidewalls of the first memory cell 223a and outer sidewalls of the second memory cell 223b.

FIGS. 6-9 illustrate cross-sectional views 600-900 of some embodiments of a first method of forming a memory device including an MTJ memory element with a shunting structure according to the present disclosure. Although the cross-sectional views 600-900 shown in FIGS. 6-9 are described with reference to a method, it will be appreciated that the structures shown in FIGS. 6-9 are not limited to the method but rather may stand alone separate of the method. Furthermore, although FIGS. 6-9 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 6:
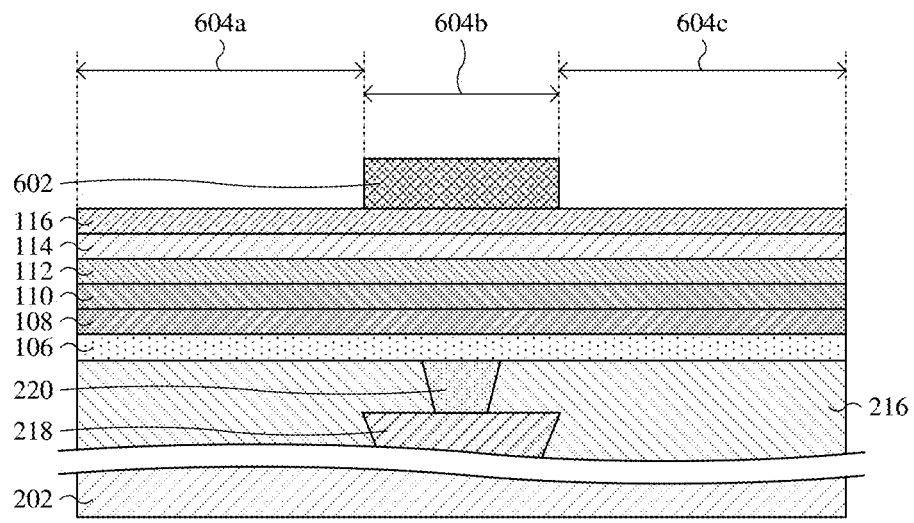
FIGS. 6-9 illustrate cross-sectional views of some embodiments of a first method of forming a memory device including a MTJ memory element with a shunting structure, according to the present disclosure.

As shown in cross-sectional view 600 of FIG. 6, a first IMD structure 216 is formed over a semiconductor substrate 202. A bottom conductive wire 218 is formed within the first IMD structure 216. In some embodiments, the bottom conductive wire 218 may be formed by way of a damascene process. The bottom conductive wire 218 may, for example, be or comprise copper, aluminum, or the like. A bottom electrode via 220 is formed within the first IMD structure 216 and overlies the bottom conductive wire 218. A bottom electrode 106 is formed over the first IMD structure 216 and the bottom electrode via 220. A reference layer 108 is formed over the bottom electrode 106. A tunnel barrier layer 110 is formed over the reference layer 108. A free layer 112 is formed over the tunnel barrier layer 110. A capping dielectric layer 114 is formed over the free layer 112. A conductive capping layer 116 is formed over the capping dielectric layer 114. A masking layer 602 is formed over the conductive capping layer 116. The masking layer 602 covers a center region 604b of the conductive capping layer 116 and leaves first and second sacrificial regions 604a, 604c exposed. In some embodiments, the above layers may be formed using a deposition process such as, for example, chemical vapor deposition (CVD), physical vapor deposition (PVD), some other suitable deposition process(es), or any combination of the foregoing. In some embodiments, a memory cell stack comprises the conductive capping layer 116, the capping dielectric layer 114, the free layer 112, the tunnel barrier layer 110, and the reference layer 108.

In some embodiments, the free layer 112 is formed to a thickness within a range of about 0.1 to 10 nanometers. In some embodiments, the capping dielectric layer 114 is formed to a thickness within a range of about 0.1 to 10 nanometers. In yet further embodiments, the conductive capping layer 116 is formed to a thickness within a range of about 0.1 to 10 nanometers.

Figure 7:
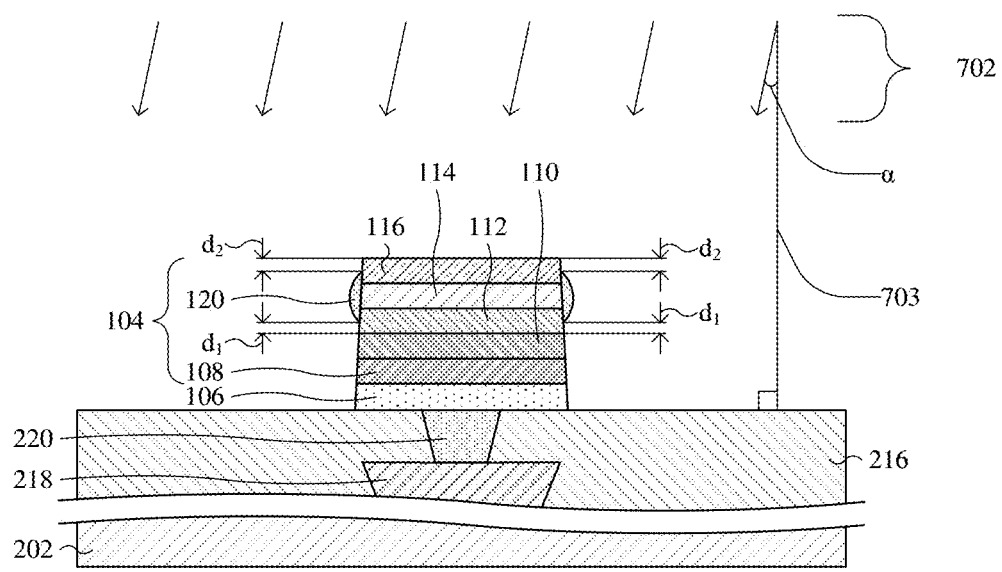

As shown in cross-sectional view 700 of FIG. 7, a removal process is performed to remove a portion of the conductive capping layer 116 and portions of layers beneath the conductive capping layer 116, thereby defining the MTJ memory element 104. A shunting structure 120 is formed on outer sidewalls of the free layer 112, outer sidewalls of the capping dielectric layer 114, and outer sidewalls of the conductive capping layer 116 by virtue of the removal process (e.g., by re-deposition of conductive materials on the aforementioned outer sidewalls during the removal process). In some embodiments, the removal process includes performing an etching process and exposing the layers beneath the masking layer (602 of FIG. 6) within the first and second sacrificial regions (604a, 604c of FIG. 6) to one or more etchants 702.

The etching process, for example, may be performed by a photolithography/etching process and/or some other suitable patterning process(es). In some embodiments, the etching process may comprise a sputter etching process or a plasma etching process, which uses etchant particles that are incident upon one or more layers over the semiconductor substrate 202 at an angle α. In some embodiments, the angle α is within a range of approximately −60° to 60° relative to a line 703 that is perpendicular to an upper surface of the semiconductor substrate 202. The angle α and a power of the etching process is optimized and/or adjusted to control formation of the shunting structure 120 on outer sidewalls of the free layer 112, outer sidewalls of the capping dielectric layer 114, and outer sidewalls of the conductive capping layer 116. In some embodiments, the angle α and the power of the etching process is optimized and/or adjusted during the etching process to facilitate conductive material forming above outer sidewalls of the tunnel barrier layer 110. In yet further embodiments, if conductive material forms on the outer sidewalls of the tunnel barrier layer 110 it may render the function of electrical tunneling effect between the reference layer 108 and the free layer 112 invalid, thereby rendering the MTJ memory element 104 inoperable. In yet further embodiments, the etching process may be a plasma etching process that uses a power source (e.g., a transformer coupled plasma source, an inductively coupled plasma source, or the like) having a power within a range of approximately 200 to 1200 Volts (V).

In some embodiments, the etching process comprises at least 3 cycles of a main etching process subsequently followed by trimming etch(es) (a total of at least 6 processes and/or etches). For example, the main etching process(es) may include a high power etch (e.g., between approximately 400V to 1200V) with the one or more etchants 702 at a small angle α (e.g., the small angle α is within a range of approximately 10° to 45° and/or −10° to −45°). Further, the trimming etch(es) may, for example, include a low power etch (e.g., between approximately 100V to 400V) with the one or more etchants 702 at a large angle α (e.g., the large angle α is within a range of approximately 30° to 60° and/or −30° to −60°). In some embodiments, the main etching process(es) may be used to form a shape of the MTJ memory elements 104 while concurrently re-depositing conductive materials on outer sidewalls off the MTJ memory element 104 (e.g., forming the shunting structure 120). In yet other embodiments, the trimming etch(es) may be used to reduce the re-deposited conductive materials on the outer sidewalls of the MTJ memory element 104 below an upper surface of the tunnel barrier layer 110. In some embodiments, the one or more etchants 702 may, for example, be or comprise argon, helium, or the like.

In some embodiments, the etching process is performed such that a bottom surface of the shunting structure 120 is separated from a top surface of the tunnel barrier layer 110 by a first distance $d_1$. In some embodiments, if the shunting structure 120 is not separated from the tunnel barrier layer 110 by the first distance $d_1$ then the tunnel barrier layer 110 may be directly electrically coupled to the capping dielectric layer 114 and/or the conductive capping layer 116. This, in part, may render the MTJ memory element 104 inoperable. In further embodiments, if the shunting structure 120 does not extend over the outer sidewalls of the free layer 112 (i.e., the first distance $d_1$ is) then the conductive capping layer 116 may not be directly electrically coupled to the free layer 112. This, in part, may decrease the MR ratio of the MTJ memory element 104 because an effect of the series resistance of the capping dielectric layer 114 between the top and bottom electrodes 118, 106 has not been reduced (e.g., by the shunting structure 120).

In some embodiments, the etching process is performed such that a top surface of the shunting structure 120 is separated from a top surface of the conductive capping layer 116 by a second distance $d_2$. In some embodiments, if the top surface of the shunting structure 120 is not above a top surface of the capping dielectric layer 114 then the conductive capping layer 116 may not be directly electrically coupled to the free layer 112. This, in part, may decrease the MR ratio of the MTJ memory element 104 because an effect of the series resistance of the capping dielectric layer 114 between the top and bottom electrodes 118, 106 has not been reduced (e.g., by the shunting structure 120). In some embodiments, the second distance $d_2$ is eliminated such that the top surface of the shunting structure 120 is aligned with or above the top surface of the conductive capping layer 116 (not shown).

Figure 8:
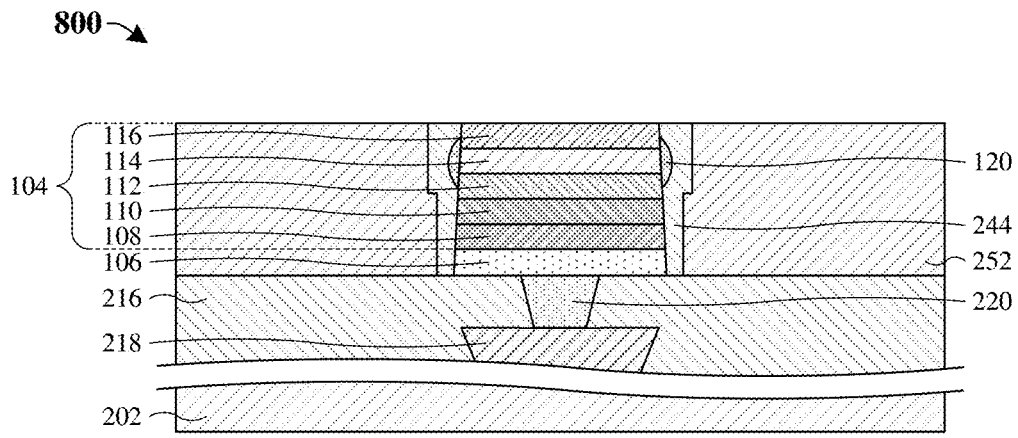

As shown in cross-sectional view 800 of FIG. 8, a first sidewall spacer 244 is formed around the MTJ memory element 104 and the bottom electrode 106. Additionally, a first IMD layer 252 is formed around the first sidewall spacer 244.

Figure 9:
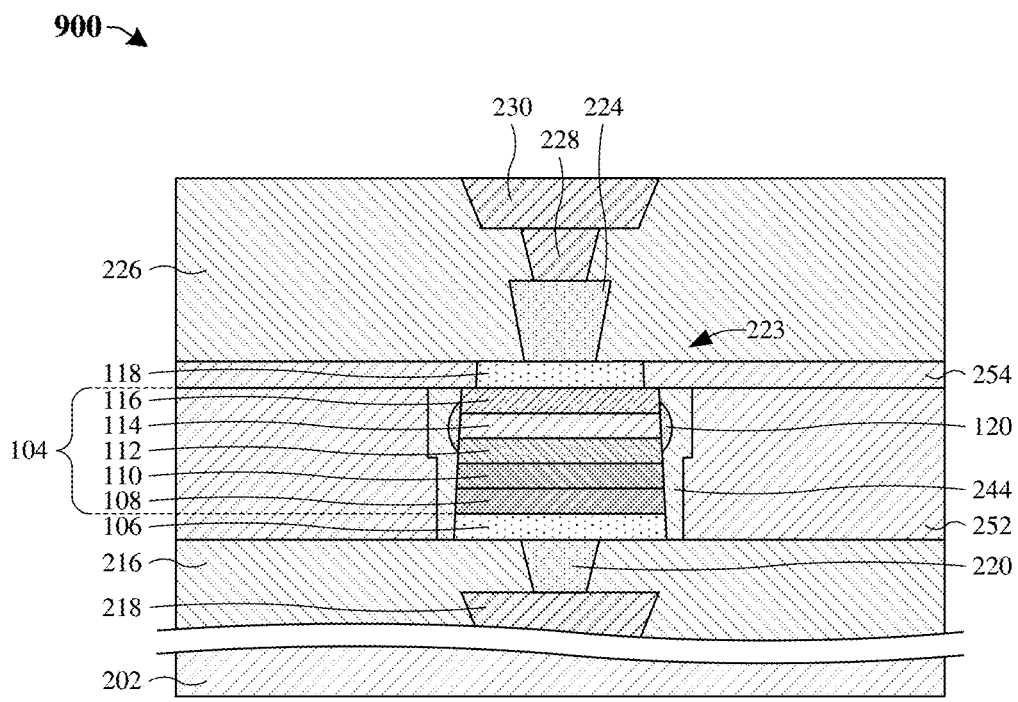

As shown in cross-sectional view 900 of FIG. 9, a second IMD layer 254 is formed over the first IMD layer 252. A top electrode 118 is formed over the MTJ memory element 104 such that the top electrode 118 extends through the second IMD layer 254, thereby defining a memory cell 223. A top dielectric structure 226 is formed over the second IMD layer 254. In some embodiments, the top dielectric structure 226 may comprise one or more dielectric layers. A top electrode via 224 is formed over the memory cell 223 and contacts an upper surface of the top electrode 118. A top conductive via 228 is formed over the top electrode via 224 and a top conductive wire 230 is formed over the top conductive via 228. In some embodiments, the top conductive via and/or wire 228, 230 may be formed by way of a damascene process and/or a dual damascene process. The top conductive via and wire 228, 230 may, for example, be or comprise aluminum, copper, or the like. The top electrode via 224 may, for example, be or comprise titanium, tungsten, titanium nitride, or the like.

FIGS. 10-17 illustrate cross-sectional views 1000-1700 of some embodiments of a second method of forming a memory device including an MTJ memory element with a shunting structure according to the present disclosure. Although the cross-sectional views 1000-1700 shown in FIGS. 10-17 are described with reference to a method, it will be appreciated that the structures shown in FIGS. 10-17 are not limited to the method but rather may stand alone separate of the method. Furthermore, although FIGS. 10-17 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 10:
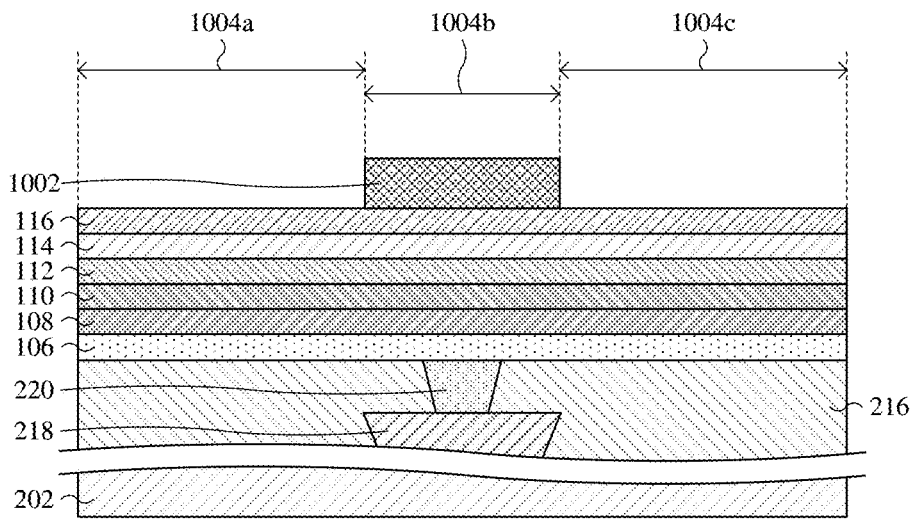
FIGS. 10-17 illustrate cross-sectional views of some embodiments of a second method of forming a memory device including a MTJ memory element with a shunting structure, according to the present disclosure.

As shown in cross-sectional view 1000 of FIG. 10, a first IMD structure 216 is formed over a semiconductor substrate 202. A bottom conductive wire 218 is formed within the first IMD structure 216. In some embodiments, the bottom conductive wire 218 may be formed by way of a damascene process. The bottom conductive wire 218 may, for example, be or comprise copper, aluminum, or the like. A bottom electrode via 220 is formed within the first IMD structure 216 and overlies the bottom conductive wire 218. A bottom electrode 106 is formed over the first IMD structure 216 and the bottom electrode via 220. A reference layer 108 is formed over the bottom electrode 106. A tunnel barrier layer 110 is formed over the reference layer 108. A free layer 112 is formed over the tunnel barrier layer 110. A capping dielectric layer 114 is formed over the free layer 112. A conductive capping layer 116 is formed over the capping dielectric layer 114. A masking layer 1002 is formed over the conductive capping layer 116. The masking layer 1002 covers a center region 1004b of the conductive capping layer 116 and leaves first and second sacrificial regions 1004a, 1004c exposed. In some embodiments, the above layers may be formed using a deposition process such as, for example, chemical vapor deposition (CVD), physical vapor deposition (PVD), some other suitable deposition process(es), or any combination of the foregoing. In some embodiments, a memory cell stack comprises the conductive capping layer 116, the capping dielectric layer 114, the free layer 112, the tunnel barrier layer 110, and the reference layer 108.

Figure 11:
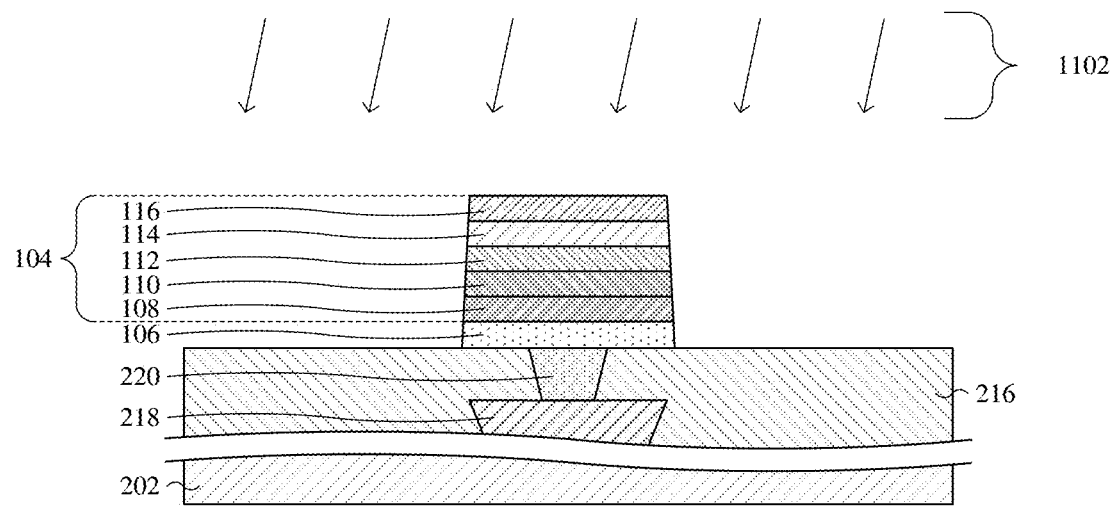

As shown in cross-sectional view 1100 of FIG. 11, a first removal process is performed to remove a portion of the conductive capping layer 116 and portions of layers beneath the conductive capping layer 116, thereby defining the MTJ memory element 104. In some embodiments, the removal process includes performing an etching process and exposing the layers beneath the masking layer (1002 of FIG. 10) within the first and second sacrificial regions (1004a, 1004c of FIG. 10) to one or more etchant 1102. In some embodiments, the one or more etchants 1102 may, for example, be or comprise argon. In some embodiments, the first removal process is performed in such a manner as to reduce re-deposition of conductive materials on outer sidewalls of the MTJ memory element 104. In further embodiments, one or more trimming etch(es) may be performed during the first removal process to remove excess materials (e.g., conductive materials) formed on the outer sidewalls of the MTJ memory element 104 (in some embodiments, the one or more trimming etch(es) are performed and/or configured as described in FIG. 7 above).

Figure 12:
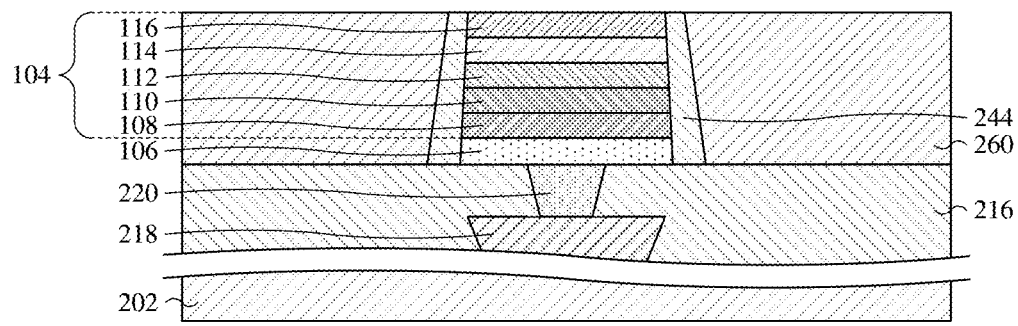

As shown in cross-sectional view 1200 of FIG. 12, a first sidewall spacer 244 is formed around the MTJ memory element 104 and the bottom electrode 106. Additionally, a second sidewall spacer 260 is formed around the first sidewall spacer 244. In some embodiments, a material of the first sidewall spacer 244 is different than a material of the second sidewall spacer 260.

Figure 13:
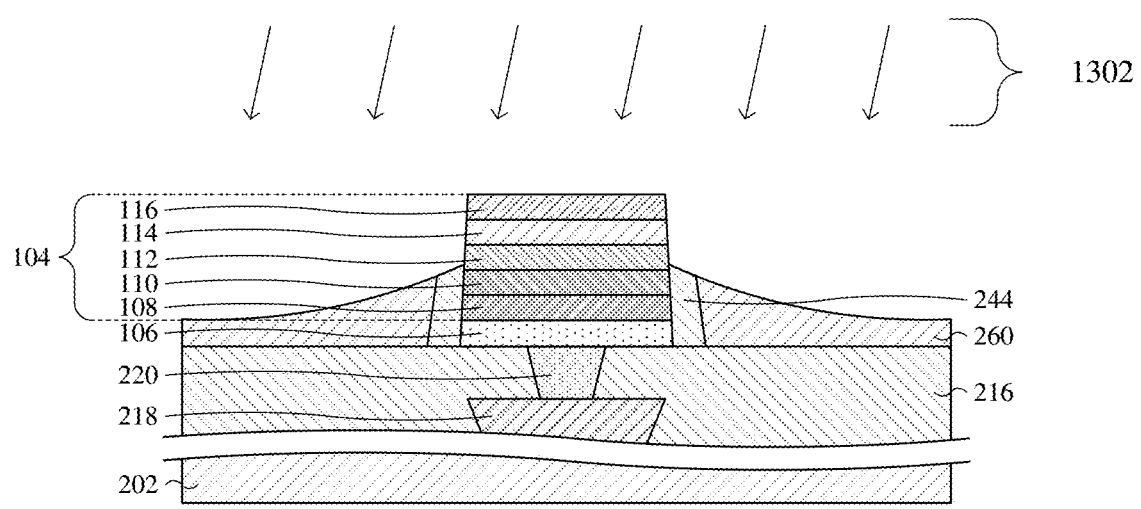

As shown in cross-sectional view 1300 of FIG. 13, a second removal process is performed to remove portions of the first sidewall spacer 244 and the second sidewall spacer 260. In some embodiments, the second removal process includes performing an etching process and exposing the first and second sidewall spacers 244, 260 to one or more etchants 1302. In some embodiments, the one or more etchants 1302 may, for example, be or comprise argon. In yet further embodiments, a masking layer (not shown) is formed over the conductive capping layer 116 before performing the second removal process and subsequently removed after patterning the first and second sidewall spacers 244, 260 (not shown).

The second removal process is performed such that outer sidewalls of the conductive capping layer 116, outer sidewalls of the capping dielectric layer 114, and outer sidewalls of the free layer 112 are exposed. Further, outer sidewalls of the tunnel barrier layer 110, outer sidewalls of the reference layer 108, and outer sidewalls of the bottom electrode 106 remain covered by the first sidewall spacer 244 and/or the second sidewall spacer 260 after performing the second removal process.

Figure 14:
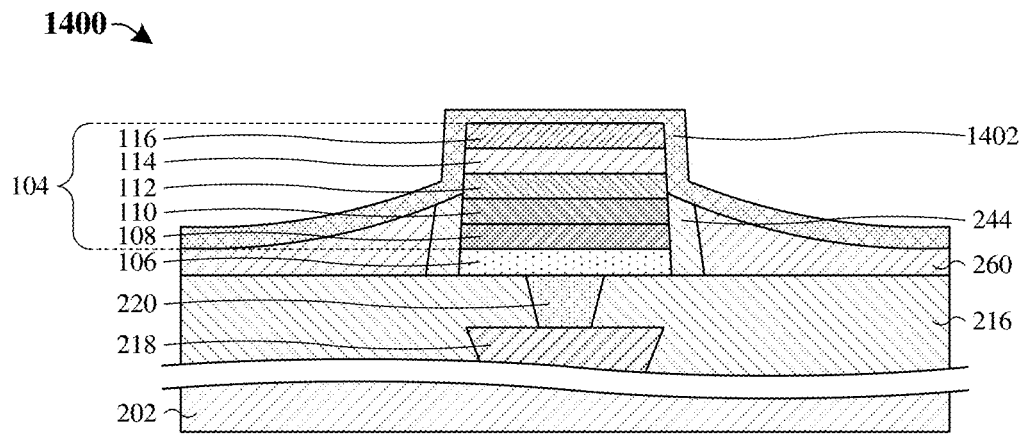

As shown in cross-sectional view 1400 of FIG. 14, a conductive layer 1402 is formed over the conductive capping layer 116 and the first and second sidewall spacers 244, 260. The conductive layer 1402 directly contacts the outer sidewalls of the conductive capping layer 116, outer sidewalls of the capping dielectric layer 114, and outer sidewalls of the free layer 112. The conductive layer 1402 is electrically isolated from the outer sidewalls of the tunnel barrier layer 110, outer sidewalls of the reference layer 108, and outer sidewalls of the bottom electrode 106 by the first and/or second sidewall spacers 244, 260.

Figure 15:
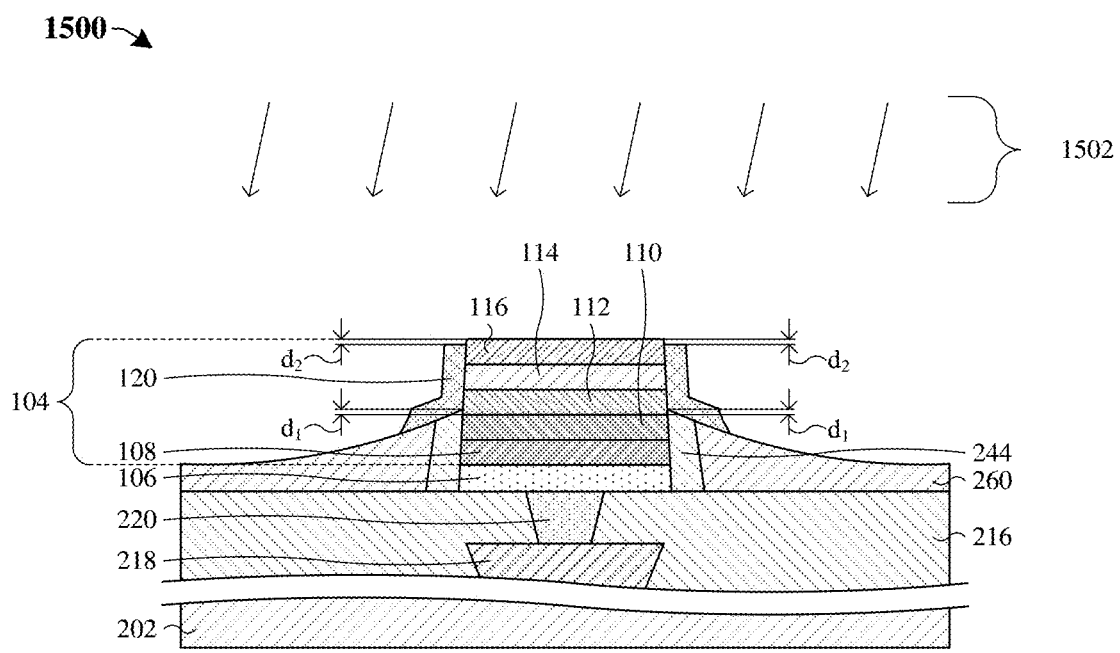

As shown in cross-sectional view 1500 of FIG. 15, a third removal process is performed to remove a portion of the conductive layer (1402 of FIG. 14), thereby defining a shunting structure 120. In some embodiments, the third removal process includes performing an etching process and exposing the conductive layer (1402 of FIG. 14) to one or more etchants 1502. In some embodiments, the one or more etchants 1502 may, for example, be or comprise argon. In some embodiments, a masking layer (not shown) is formed over portions of the conductive layer (1402 of FIG. 14) before performing the third removal process and subsequently removed after patterning the conductive layer (1402 of FIG. 14) (not shown). In other embodiments, the third removal process may comprise a blanket etch process (e.g., an un-masked etch process). In yet further embodiments, the shunting structure 120 extends continuously over the outer sidewalls of the conductive capping layer 116 and a top surface of the conductive capping layer 116 (not shown).

In some embodiments, a lower surface of the shunting structure 120 is separated from a top surface of the tunnel barrier layer 110 by a first distance $d_1$. In some embodiments, if the shunting structure 120 is not separated from the tunnel barrier layer 110 by the first distance $d_1$ (i.e., the first distance $d_1$ is negative) then the tunnel barrier layer 110 may be directly electrically coupled to the capping dielectric layer 114 and/or the conductive capping layer 116. This, in part, may render the MTJ memory element 104 inoperable. In further embodiments, if the shunting structure 120 does not extend over the outer sidewalls of the free layer 112 then the conductive capping layer 116 may not be directly electrically coupled to the free layer 112.

In some embodiments, a top surface of the shunting structure 120 is separated from a top surface of the conductive capping layer 116 by a second distance $d_2$. In some embodiments, if the top surface of the shunting structure 120 is not above a top surface of the capping dielectric layer 114 then the conductive capping layer 116 may not be directly electrically coupled to the free layer 112. This, in part, may decrease the MR ratio of the MTJ memory element 104 because an effect of the series resistance of the capping dielectric layer 114 between the top and bottom electrodes 118, 106 has not been reduced (e.g., reduced by the shunting structure 120). In some embodiments, the second distance $d_2$ is eliminated such that the top surface of the shunting structure 120 is aligned with or above the top surface of the conductive capping layer 116 (not shown).

Figure 16:
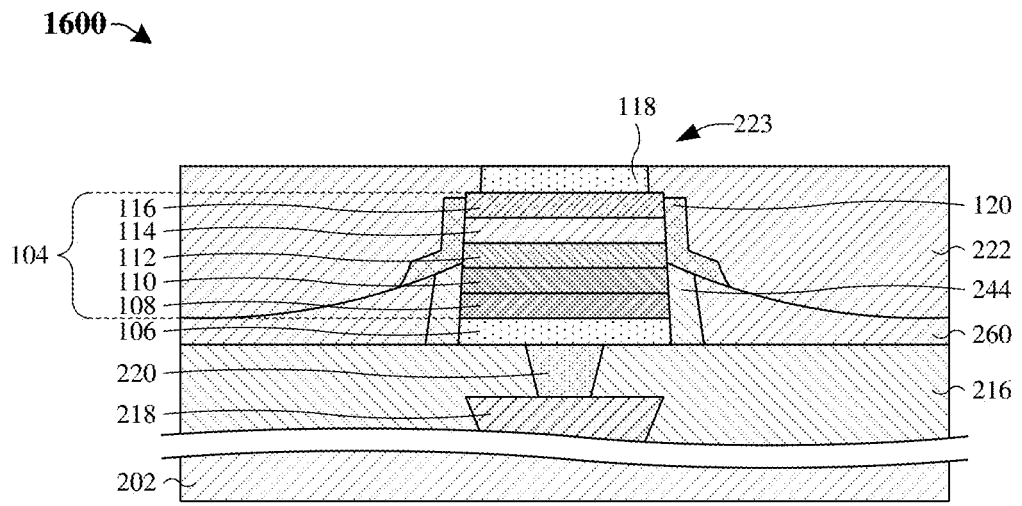

As shown in cross-sectional view 1600 of FIG. 16, a second IMD structure 222 is formed over the MTJ memory element 104 and the first and second sidewall spacers 244, 260. In some embodiments, the second IMD structure 222 may, for example, comprise one or more dielectric layers with one or more dielectric materials. A top electrode 118 is formed over the MTJ memory element 104 within the second IMD structure 222, thereby defining a memory cell 223.

Figure 17:
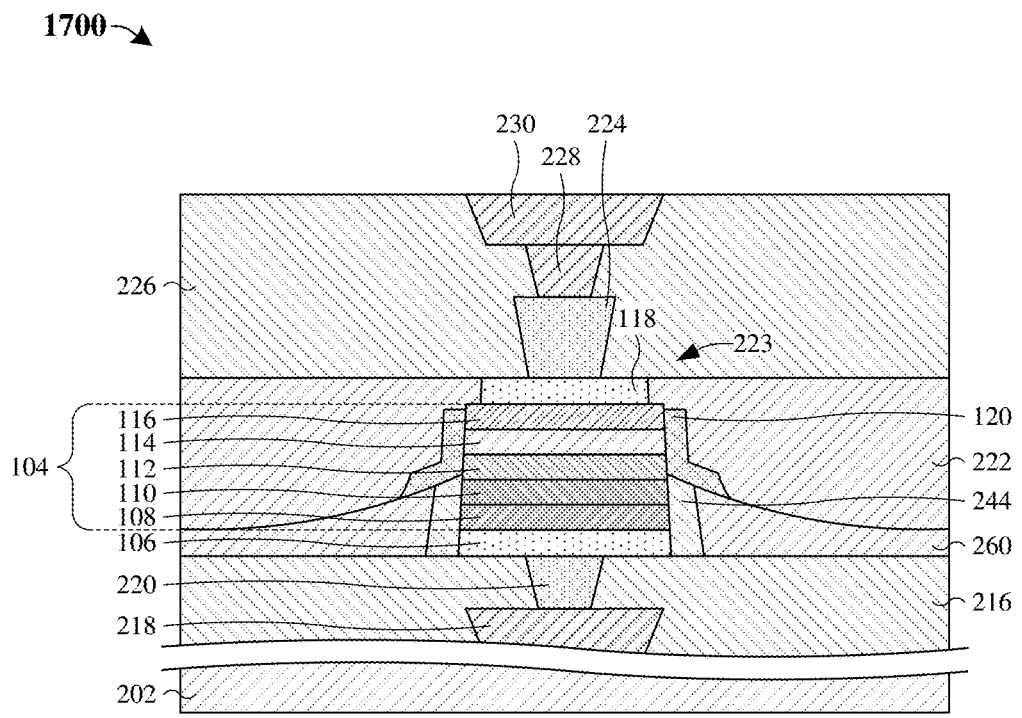

As shown in cross-sectional view 1700 of FIG. 17, a top dielectric structure 226 is formed over the second IMD structure 222. In some embodiments, the top dielectric structure 226 may comprise one or more dielectric layers. A top electrode via 224 is formed over the memory cell 223 and contacts an upper surface of the top electrode 118. A top conductive via 228 is formed over the top electrode via 224 and a top conductive wire 230 is formed over the top conductive via 228. In some embodiments, the top conductive via and/or wire 228, 230 may be formed by way of a damascene process and/or a dual damascene process. The top conductive via and wire 228, 230 may, for example, be or comprise aluminum, copper, or the like. The top electrode via 224 may, for example, be or comprise titanium, tungsten, titanium nitride, or the like.

Figure 18:
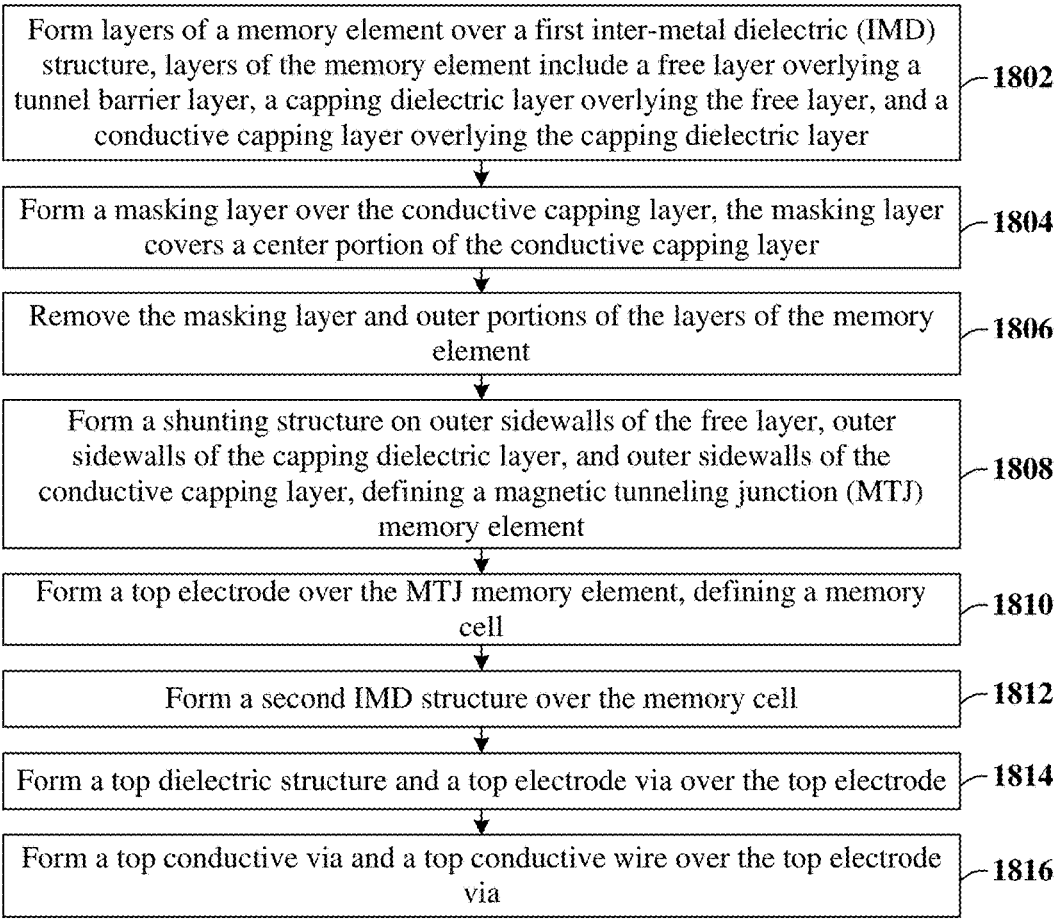
FIG. 18 illustrates a methodology in flowchart format that illustrates some embodiments of a method of forming a memory device including a MTJ memory element with a shunting structure, according to the present disclosure.

FIG. 18 illustrates a method 1800 of forming a magnetic tunneling junction (MTJ) memory element with a shunting structure. Although the method 1800 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1802, layers of a memory element are formed over a first inter-metal dielectric (IMD) structure, layers of the memory element include a free layer overlying a tunnel barrier layer, a capping dielectric layer overlying the free layer, and a conductive capping layer overlying the capping dielectric layer. FIG. 6 illustrates a cross-sectional view 600 corresponding to some embodiments of act 1802. FIG. 10 illustrates a cross-sectional view 1000 corresponding to some alternative embodiments of act 1802.

At act 1804, a masking layer is formed over the conductive capping layer, the masking layer covers a center portion of the conductive capping layer. FIG. 6 illustrates a cross-sectional view 600 corresponding to some embodiments of act 1804. FIG. 10 illustrates a cross-sectional view 1000 corresponding to some alternative embodiments of act 1804.

At act 1806, the masking layer and outer portions of the layers of the memory element are removed. FIG. 7 illustrates a cross-sectional view 700 corresponding to some embodiments of act 1806. FIG. 11 illustrates a cross-sectional view 1100 corresponding to some alternative embodiments of act 1806.

At act 1808, a shunting structure is formed on outer sidewalls of the free layer, outer sidewalls of the capping dielectric layer, and outer sidewalls of the conductive capping layer, defining a magnetic tunneling junction (MTJ) memory element. FIG. 7 illustrates a cross-sectional view 700 corresponding to some embodiments of act 1808. FIGS. 14 and 15 illustrate cross-sectional views 1400 and 1500 corresponding to some alternative embodiments of act 1808.

At act 1810, a top electrode is formed over the MTJ memory element, thereby defining a memory cell. FIG. 9 illustrates a cross-sectional view 900 corresponding to some embodiments of act 1810. FIG. 16 illustrates a cross-sectional view 1600 corresponding to some alternative embodiments of act 1810.

At act 1812, a second IMD structure is formed over the memory cell. FIG. 9 illustrates a cross-sectional view 900 corresponding to some embodiments of act 1812. FIG. 17 illustrates a cross-sectional view 1700 corresponding to some alternative embodiments of act 1812.

At act 1814, a top dielectric structure and a top electrode via are formed over the top electrode. FIG. 9 illustrates a cross-sectional view 900 corresponding to some embodiments of act 1814. FIG. 17 illustrates a cross-sectional view 1700 corresponding to some alternative embodiments of act 1814.

At act 1816, a top conductive via and a top conductive wire are formed over the top electrode via. FIG. 9 illustrates a cross-sectional view 900 corresponding to some embodiments of act 1816. FIG. 17 illustrates a cross-sectional view 1700 corresponding to some alternative embodiments of act 1816.

Accordingly, in some embodiments, the present disclosure relates to a magnetic tunneling junction (MTJ) memory element with a shunting structure. The MTJ memory element comprises a free layer overlying a tunnel barrier layer, a capping dielectric layer overlying the free layer, and a conductive capping layer overlying the capping dielectric layer. The shunting structure extends continuously over outer sidewalls of the free layer, outer sidewalls of the capping dielectric layer, and outer sidewalls of the conductive capping layer.

In some embodiments, the present application provides a memory device including a tunnel barrier layer overlying a reference layer disposed over a semiconductor substrate; a free layer overlying the tunnel barrier layer; a capping layer overlying the free layer; and a shunting structure comprising a conductive material that vertically extends continuously from an outer sidewall of the free layer to an outer sidewall of the capping layer.

In some embodiments, the present application provides a magneto-resistive random-access memory (MRAM) device including a reference layer overlying a bottom electrode; a tunnel barrier layer overlying the reference layer; a free layer overlying the tunnel barrier layer; a capping dielectric layer overlying the free layer; a conductive capping layer overlying the capping dielectric layer; and a conductive structure surrounding the free layer, the capping dielectric layer, and the conductive capping layer, wherein the conductive structure is configured to electrically couple the free layer to the conductive capping layer.

In some embodiments, the present application provides a method for forming a memory device, the method including forming a memory cell stack over a lower interconnect layer over a substrate, wherein the memory cell stack comprises a free layer overlying a tunnel barrier layer, a capping dielectric layer overlying the free layer, and a conductive capping layer overlying the capping dielectric layer; performing a first etch process on the memory cell stack according to a first masking layer; forming a shunting structure on an outer sidewall of the conductive capping layer, an outer sidewall of the capping dielectric layer, and an outer sidewall of the free layer, thereby defining a magnetic tunneling junction (MTJ) memory element; and forming a top electrode over the conductive capping layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip, comprising:
   forming a memory cell stack over a substrate, wherein the memory cell stack comprises a tunnel barrier layer, a free layer over the tunnel barrier layer, a capping dielectric layer over the free layer, and a conductive capping layer on the capping dielectric layer, wherein the free layer comprises a first magnetic orientation or a second magnetic orientation; and
   performing an etching process on the memory cell stack to define outer sidewalls of the free layer, outer sidewalls of the capping dielectric layer, and outer sidewalls of the conductive capping layer, wherein the etching process forms a conductive shunting structure along the outer sidewalls of the free layer, the outer sidewalls of the capping dielectric layer, and the outer sidewalls of the conductive capping layer, wherein a bottommost point of the conductive shunting structure in contact with the free layer is disposed above a bottom surface of the free layer.

2. The method of claim 1, wherein the conductive shunting structure comprises conductive materials from the conductive capping layer.

3. The method of claim 1, wherein the etching process comprises performing a first etch and a second etch, wherein the first etch is performed at a first power and the second etch is performed at a second power less than the first power.

4. The method of claim 3, wherein the first etch comprises disposing one or more first etchants on the memory cell stack at a first angle relative to an upper surface of the substrate, wherein the second etch comprises disposing one or more second etchants on the memory cell stack at a second angle relative to the upper surface of the substrate, wherein the first angle is less than the second angle.

5. The method of claim 4, wherein the first etch and the second etch are each a plasma etch.

6. A method for forming an integrated chip, comprising:
   depositing a memory cell stack over a substrate, wherein the memory cell stack comprises a reference layer, a tunnel barrier layer overlying and contacting the reference layer, a free layer overlying and contacting the tunnel barrier layer, and a capping layer overlying the free layer;
   performing an etching process on the memory cell stack to define a memory cell, wherein the etching process includes performing a first etch at a first power and a second etch at a second power different from the first power; and
   forming a conductive structure contacting a sidewall of the free layer and a sidewall of the capping layer, wherein a height of the conductive structure is greater than a height of the reference layer, wherein the conductive structure is offset from the reference layer by a non-zero distance.

7. The method of claim 6, further comprising:
   forming a sidewall spacer around the memory cell, wherein the conductive structure is disposed between the sidewall of the capping layer and an inner sidewall of the sidewall spacer.

8. The method of claim 6, wherein a distance between a lower surface of the conductive structure and a lower surface of the tunnel barrier layer is greater than the height of the reference layer.

9. The method of claim 6, wherein the conductive structure is formed during the etching process, and wherein the first etch is performed at a first angle relative to an upper surface of the substrate and the second etch is performed at a second angle relative to the upper surface of the substrate, wherein the first angle is less than the second angle.

10. The method of claim 9, wherein the first and second etches comprise exposing the memory cell stack to one or more etchants, wherein the one or more etchants comprise argon and/or helium.

11. The method of claim 9, wherein the first power is greater than the second power.

12. A method for forming a memory device, the method comprising:
   forming a memory cell stack over a lower interconnect layer over a substrate, wherein the memory cell stack comprises a free layer overlying a tunnel barrier layer, a capping dielectric layer overlying the free layer, and a conductive capping layer overlying the capping dielectric layer;
   performing a first etch process on the memory cell stack according to a first masking layer;
   forming a shunting structure on an outer sidewall of the conductive capping layer, an outer sidewall of the capping dielectric layer, and an outer sidewall of the free layer, thereby defining a magnetic tunneling junction (MTJ) memory element, wherein the shunting structure is formed during the first etch process; and
   forming a top electrode over the conductive capping layer, wherein the top electrode is formed after forming the shunting structure.

13. The method according to claim 12, wherein the first etch process comprises a main etching process followed subsequently by a trimming etch process, wherein the main etching process is configured to form a shape of the MTJ memory element and the trimming etch process is configured to remove redeposited conductive material(s) on outer sidewalls of the MTJ memory element below a bottom surface of the free layer.

14. The method of claim 1, wherein an outer sidewall of the conductive shunting structure is curved.

15. The method of claim 1, further comprising:
   forming a top electrode over the conductive capping layer, wherein outer sidewalls of the top electrode are spaced between the outer sidewalls of the conductive capping layer.

16. The method of claim 1, further comprising:
   forming a sidewall spacer around the memory cell stack and the conductive shunting structure, wherein a top surface of the sidewall spacer is aligned with a top surface of the conductive capping layer.

17. The method of claim 7, wherein the sidewall spacer comprises a first lateral thickness adjacent to a sidewall of the tunnel barrier layer and a second lateral thickness adjacent to a sidewall of the conductive structure, wherein the second lateral thickness is greater than the first lateral thickness.

18. The method of claim 7, wherein the sidewall spacer directly contacts a bottom surface of the conductive structure and a sidewall of the tunnel barrier layer.

19. The method of claim 1, wherein the free layer comprises a magnetic material.

20. The method of claim 1, wherein the memory cell stack further comprises a reference layer under the tunnel barrier layer, wherein the reference layer is configured to have the first magnetic orientation, wherein the free layer is configured to switch between the first magnetic orientation and the second magnetic orientation.

* * * * *